US010128383B2

(12) United States Patent
Choung

(10) Patent No.: US 10,128,383 B2
(45) Date of Patent: Nov. 13, 2018

(54) THIN FILM TRANSISTOR ARRAY SUBSTRATE AND MANUFACTURING METHOD OF THE SAME

(71) Applicant: Samsung Display Co., Ltd., Yongin (KR)

(72) Inventor: Jong Hyun Choung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 387 days.

(21) Appl. No.: 14/986,716

(22) Filed: Jan. 3, 2016

(65) Prior Publication Data

US 2016/0240691 A1    Aug. 18, 2016

(30) Foreign Application Priority Data

Feb. 13, 2015   (KR) .................. 10-2015-0022488

(51) Int. Cl.
| | |
|---|---|
| *H01L 27/12* | (2006.01) |
| *H01L 29/786* | (2006.01) |
| *H01L 29/417* | (2006.01) |

(52) U.S. Cl.
CPC ...... *H01L 29/78696* (2013.01); *H01L 27/124* (2013.01); *H01L 27/1222* (2013.01); *H01L 27/1288* (2013.01); *H01L 29/41733* (2013.01); *H01L 29/78618* (2013.01); *H01L 29/78669* (2013.01)

(58) Field of Classification Search
CPC ... H01L 27/124; H01L 27/1288; H01L 27/12; H01L 27/1248; H01L 27/1255
USPC ................. 257/401, 40, 66, 71, 72
See application file for complete search history.

(56) References Cited

U.S. PATENT DOCUMENTS

| | | | |
|---|---|---|---|
| 2005/0140888 A1 | 6/2005 | Kwon | |
| 2011/0254002 A1* | 10/2011 | Ahn | ..................... H01L 27/1214 257/49 |
| 2012/0126233 A1* | 5/2012 | Chang | ................... H01L 27/124 257/59 |

FOREIGN PATENT DOCUMENTS

| | | |
|---|---|---|
| KR | 1020000009316 | 2/2000 |
| KR | 1020050070325 | 7/2005 |
| KR | 1020060068442 | 6/2006 |
| KR | 1020110064272 | 6/2011 |

* cited by examiner

*Primary Examiner* — Cory Eskridge
(74) *Attorney, Agent, or Firm* — Cantor Colburn LLP

(57) ABSTRACT

A thin film transistor array substrate includes a first conductive pattern group including a gate line extending along a first direction, data lines extending along a second direction crossing the first direction and spaced apart from each other along the second direction with the gate line there between, and a gate electrode protruding from the gate line, an active pattern disposed on the gate electrode to overlap the gate electrode, a second conductive pattern group including a bridge pattern coupling the data lines, a source electrode extending to an upper portion of the active pattern from the bridge pattern and a drain electrode spaced apart from the source electrode, facing the source electrode and disposed on the active pattern and metal patterns each stacked between the active pattern and the source electrode and between the active pattern and the drain electrode.

11 Claims, 14 Drawing Sheets

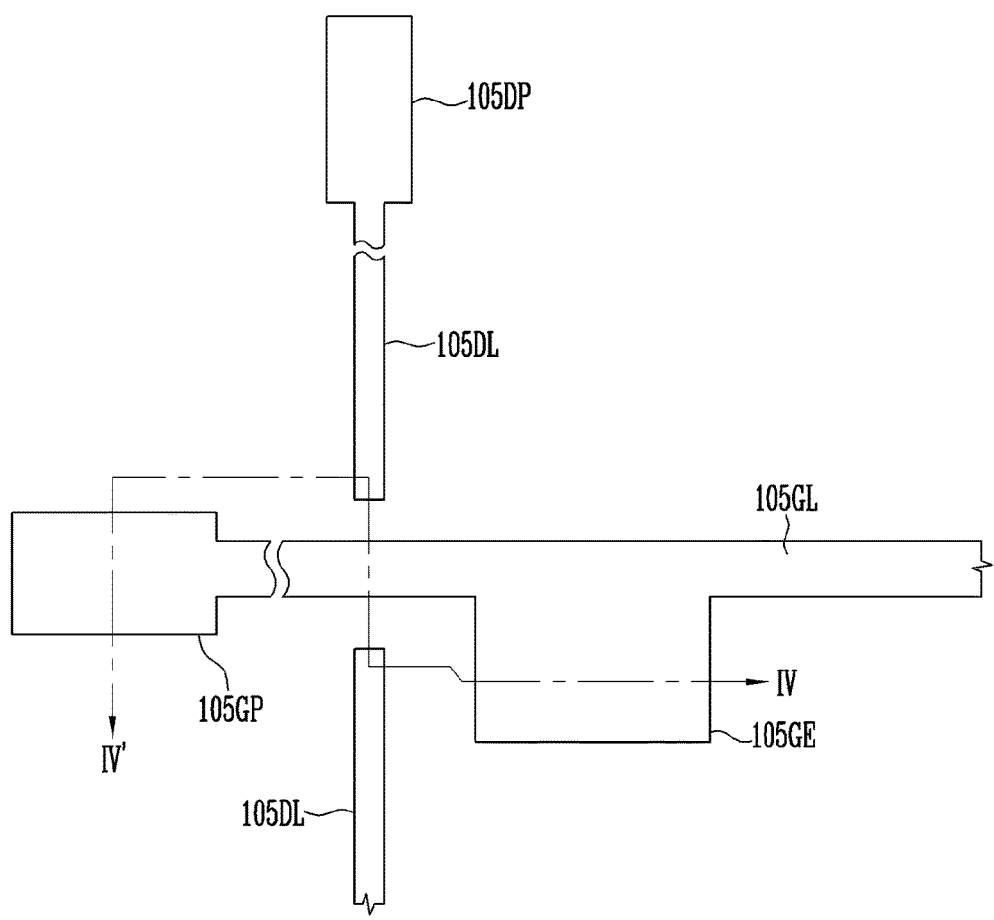

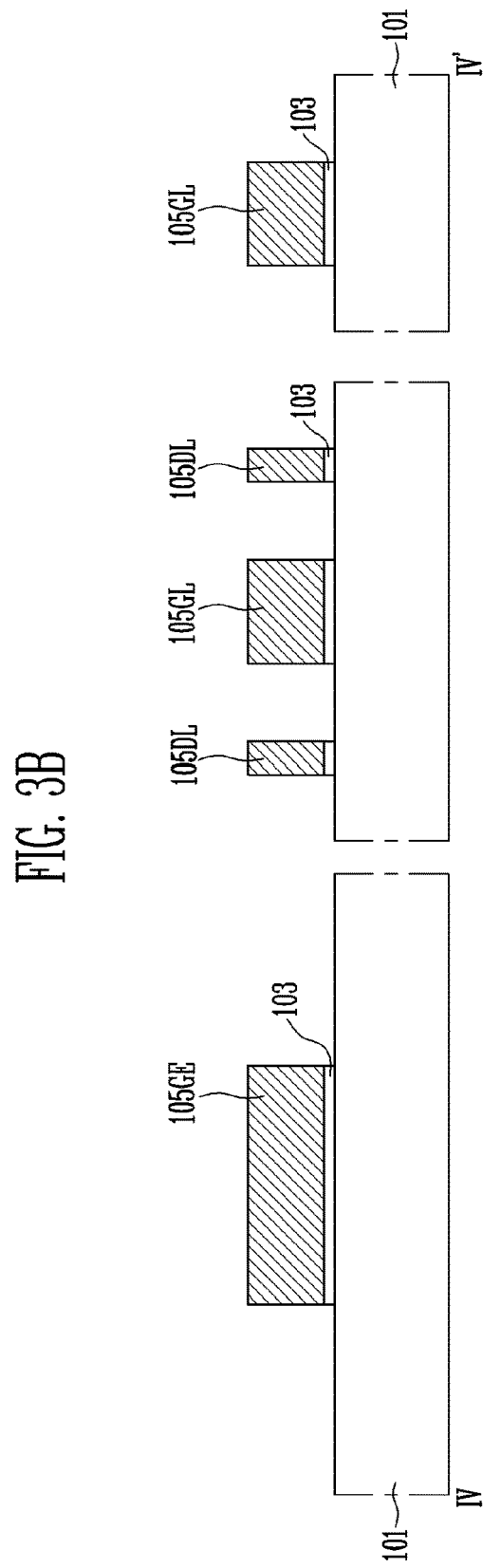

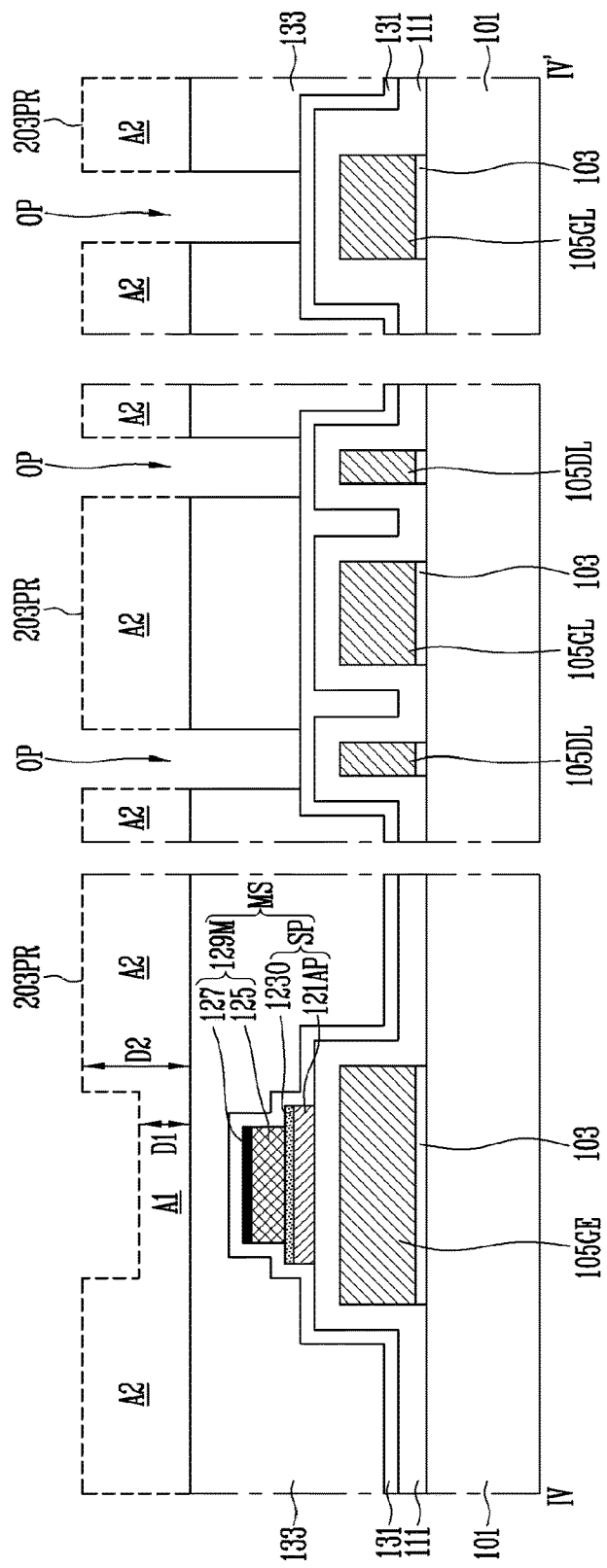

THIN FILM TRANSISTOR ARRAY SUBSTRATE AND MANUFACTURING METHOD OF THE SAME

This application claims priority to Korean Patent Application No. 10-2015-0022488, filed on Feb. 13, 2015, and all the benefits accruing therefrom under 35 U.S.C. § 119, the content of which in its entirety is herein incorporated by reference.

BACKGROUND

1. Field

Exemplary embodiments relate to a thin film transistor array substrate and a manufacturing method of the same.

2. Description of the Related Art

Among display devices, flat panel display devices are widely used because weight can be reduced and a thin film can be used. A flat panel display device includes various display devices such as a liquid crystal display device, an organic light emitting display device and the like. The flat panel display device may include pixels arranged in matrix form. The flat panel display device may include a thin film transistor ("TFT") array substrate having various devices for driving a pixel.

The TFT array substrate may include TFTs coupled to gate lines transmitting gate signals, data lines transmitting data signals and TFTs coupled to the gate lines and the data lines. Each of the TFTs may includes a gate electrode extending from the corresponding gate line, a source electrode extending from the corresponding data line, a drain electrode facing the source electrode, and a semiconductor layer acting as a channel, and may be used as a switching device.

Various technologies relating to the above-described TFT array substrate are being developed.

SUMMARY

Exemplary embodiments may be realized by providing a thin film transistor ("TFT") array substrate, including, a first conductive pattern group including a gate line extending along a first direction, data lines extending along a second direction crossing the first direction and spaced apart from each other along the second direction with the gate line therebetween, and a gate electrode protruding from the gate line, an active pattern disposed on the gate electrode to overlap the gate electrode, a second conductive pattern group including a bridge pattern coupling the data lines, a source electrode extending to an upper portion of the active pattern from the bridge pattern and a drain electrode spaced apart from the source electrode, facing the source electrode and disposed on the active pattern and metal patterns each stacked between the active pattern and the source electrode and between the active pattern and the drain electrode.

In an exemplary embodiment, the TFT array substrate may further include ohmic contact patterns stacked between the metal patterns and the active pattern.

In an exemplary embodiment, the metal patterns and the ohmic contact patterns may expose an area of the active pattern which does not overlap the source electrode and the drain electrode.

In an exemplary embodiment, the ohmic contact patterns may include a semiconductor layer doped with impurities.

In an exemplary embodiment, the TFT array substrate may further include a gate insulating layer disposed between the first conductive pattern group and the active pattern, covering the first conductive pattern group and being passed through by bridge contact holes exposing the data lines, a first protective layer disposed between the gate insulating layer and the second conductive pattern group and being passed through by the active hole exposing the active pattern and the bridge contact holes and having a flat surface, a second protective layer pattern covering the active pattern and an opaque resin pattern disposed on the second protective layer pattern.

In an exemplary embodiment, the bridge pattern may be disposed between every pair of data lines adjacent to each other among the data lines and fills the bridge contact holes.

In an exemplary embodiment, a size of the active hole may be equal to or greater than that of the active pattern.

In an exemplary embodiment, a size of the second protective layer pattern and the opaque resin pattern may be equal to or greater than that of the active hole, or equal to or less than a size of the gate electrode.

In an exemplary embodiment, the first conductive pattern group may further include a first gate pad portion extending from one end of the gate line and a first data pad portion extending from one end of an outermost data line among the data lines, and the second conductive pattern group may further include a second gate pad portion coupled to the first gate pad portion and a second data pad portion coupled to the first data pad portion.

In an exemplary embodiment, the second conductive pattern group may further include a pixel electrode extending from the drain electrode.

In an exemplary embodiment, the second conductive pattern group may include a transparent conductive layer.

In an exemplary embodiment, the metal patterns may include a conductive material having a lower resistance than that of the second conductive pattern group.

A method of manufacturing a TFT array substrate may include forming a first conductive pattern group including a gate line extending along a first direction, data lines extending along a second direction crossing the first direction and spaced apart from each other along the second direction with the gate line therebetween, and a gate electrode protruding from the gate line, forming a gate insulating layer covering the first conductive pattern group, forming a stack structure, including an active pattern and a preliminary metal pattern disposed on the active pattern, on the gate insulating layer to overlap the gate electrode, forming a first protective layer including an active hole exposing the stack structure and bridge contact holes extending to the gate insulating layer and exposing the data lines, forming a second conductive pattern group including a bridge pattern filling the bridge contact holes and coupling the data lines, a source electrode extending from the bridge pattern to an upper portion of the stack structure, and a drain electrode spaced apart from the source electrode, facing the source electrode and disposed on the stack structure and forming metal patterns exposing the active pattern by etching the preliminary metal pattern exposed by the second conductive pattern group.

In an exemplary embodiment, the method may further include, where the stack structure further includes a preliminary ohmic contact pattern disposed between the active pattern and the preliminary metal pattern, after the forming the metal patterns, forming the preliminary ohmic contact pattern exposing the active pattern by etching the preliminary ohmic contact pattern exposed by the metal patterns.

In an exemplary embodiment, the forming the stack structure may include stacking a first semiconductor layer, a second semiconductor layer doped with impurities and a metal layer sequentially on the gate insulating layer, forming a mask pattern on the metal layer, forming the preliminary metal pattern having a smaller size than a size of the mask pattern by wet etching the metal layer using the mask pattern as an etch barrier, forming the preliminary ohmic contact pattern and the active pattern having a size equal to or greater than a size of the preliminary metal pattern by dry etching the second semiconductor layer and the first semiconductor layer using the mask pattern as an etch barrier and removing the mask pattern, where an edge of an upper surface of the preliminary ohmic contact pattern and the active pattern is exposed by the preliminary metal pattern.

In an exemplary embodiment, the forming the first protective layer including the active hole and the bridge contact holes may include forming a lower protective layer covering the stack structure on the gate insulating layer, forming an upper protective layer having a flat surface on the lower protective layer, forming a mask pattern including an opening exposing the data lines on the upper protective layer, a first area having a first thickness and a second area having a second thickness that is greater than the first thickness, etching the upper protective layer exposed through the opening using the mask pattern as an etch barrier, reducing a thickness of the mask pattern such that the first area is removed and the second area remains and forming the bridge contact holes and the active holes by etching the upper protective layer, the lower protective layer and the gate insulating layer using the remaining second area as an etch barrier.

In an exemplary embodiment, the bridge pattern may be disposed between every pair of adjacent data lines among the data lines.

In an exemplary embodiment, a size of the active hole may be the same as, or greater than, a size of the active pattern.

In an exemplary embodiment, in the forming the second conductive pattern group, a pixel electrode extending from the source electrode may be additionally formed.

In an exemplary embodiment, the method may further include, after the forming the metal patterns, forming a second protective layer covering the active pattern exposed by the metal patterns, forming an opaque resin layer on the second protective layer and forming a second protective layer pattern and an opaque resin pattern overlapping the active pattern by etching the opaque resin layer and the second protective layer.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which:

FIGS. 3A and 3B are a plan view and a cross-sectional view, respectively, for illustrating an exemplary embodiment of a first mask process according to the invention.

FIGS. 5A to 5C are a plan view and cross-sectional views, respectively, for illustrating an exemplary embodiment of a third mask process according to the invention.

DETAILED DESCRIPTION

Figure 1:
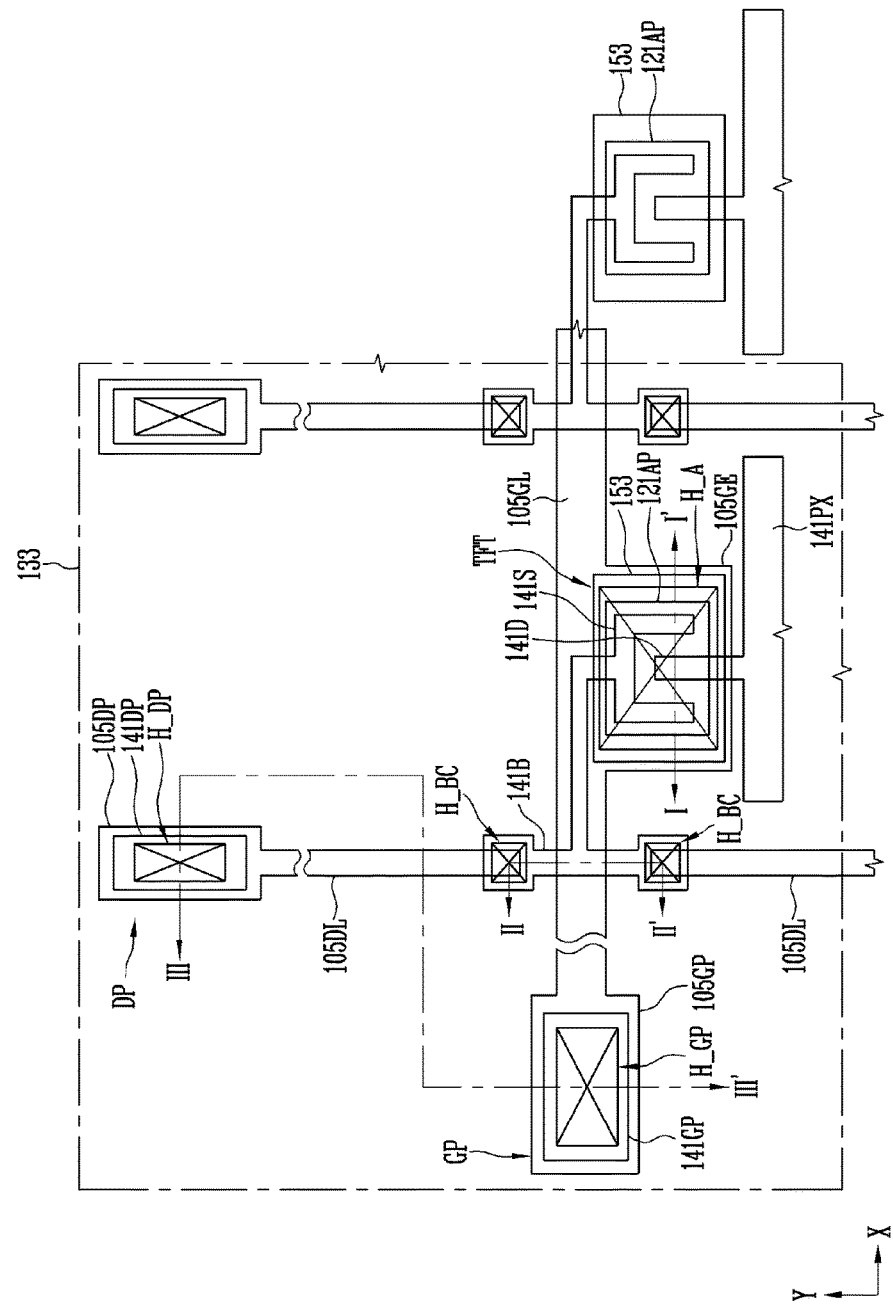
FIG. 1 is a plan view illustrating an exemplary embodiment of a thin film transistor array substrate according to the invention.

In the following detailed description, only certain exemplary embodiments of the invention have been shown and described, simply by way of illustration. As those skilled in the art would realize, the described embodiments may be modified in various different ways, all without departing from the spirit or scope of the invention. Accordingly, the drawings and description are to be regarded as illustrative in nature and not restrictive. In addition, it will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. In an exemplary embodiment, when the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
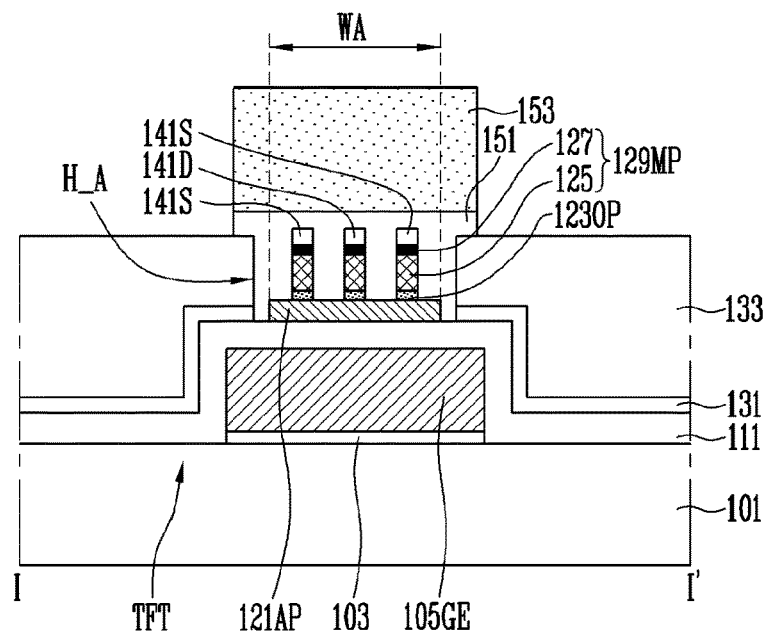
FIGS. 2A to 2C are cross-sectional views cut along lines "I-I", "II-II", "III-III" shown in FIG. 1.
Figure 2B:
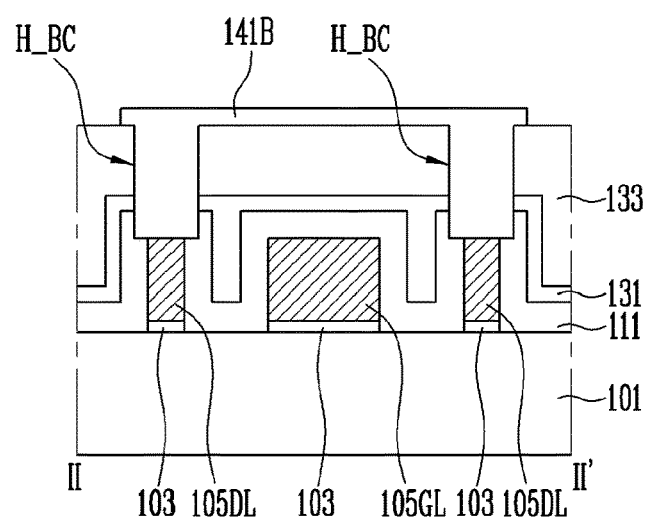
Figure 2C:
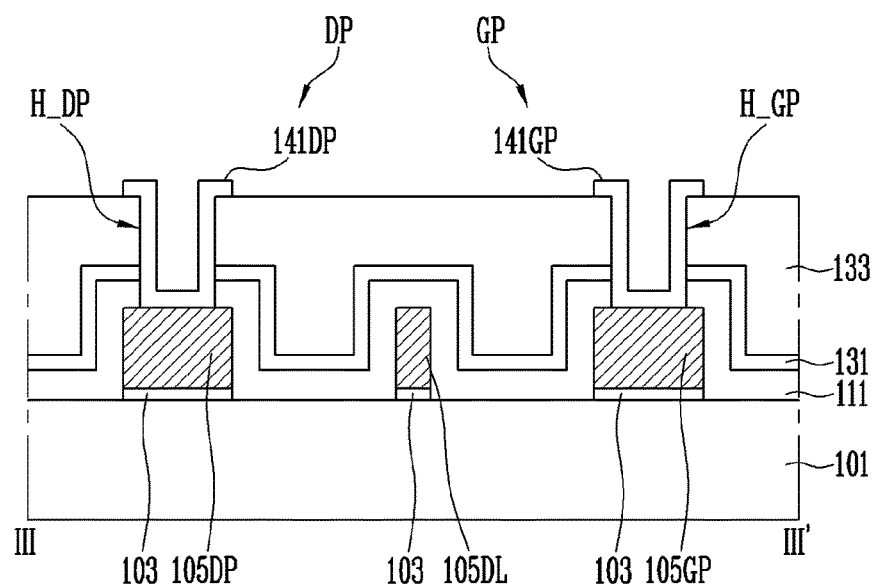

FIG. 1 is a plan view illustrating a thin film transistor ("TFT") array substrate according to an exemplary embodiment. FIGS. 2A to 2C are cross-sectional views cut along lines "I-I", "II-II", "III-III" shown in FIG. 1, respectively.

Referring to FIGS. 1 and 2A to 2C, a TFT array substrate according to an exemplary embodiment may include a TFT disposed on a substrate 101 and a pixel electrode 141PX, data lines 105DL and gate lines 105GL coupled to the TFT. A gate pad GP to which a signal is applied from an external device may be coupled to one end of the gate line 105GL extending along a first direction X. A data pad DP to which a signal is applied from an external device may be coupled to one end of the data line 105DL that is disposed at an outermost perimeter among the data lines 105DL arranged along a second direction Y crossing the first direction X.

The gate line 105GL may extend along the first direction X. Although one gate line 105GL is shown in the drawings, the gate lines 105GL may be spaced apart, with a pixel area therebetween, along the second direction Y crossing the first direction X The data lines 105DL may be disposed in a matrix form along the first and second directions X and Y. Each of the data lines 105DL may extend along the second direction Y. The data lines 105DL arranged in a row along the second direction Y may be electrically coupled via the bridge pattern 141B. The bridge pattern 141B may be disposed between every pair of data lines adjacent to each other among the data lines 105DL arranged in a row along the second direction Y. The data lines 105DL arranged along the second direction Y may be spaced apart with the gate line 105GL therebetween. Accordingly, the data lines 105DL may not overlap the gate line 105GL. The data lines 105DL may be arranged along the first direction X, spaced apart from each other, with a pixel area therebetween.

A gate pad GP may include a first gate pad portion 105GP extending from one end of the gate line 105GL and a second gate pad portion 141GP contacting the first gate pad portion 105GP.

A data pad DP may include a first data pad portion 105DP extending from one end of the data line 105DL disposed at the outermost perimeter of the data lines 105DL arranged in the second direction Y and a second data pad portion 141DP contacting the first data pad portion 105DP.

A TFT may include a gate electrode 105GE, an active pattern 121AP, a source electrode 141S and a drain electrode 141D. Metal patterns 129MP may be stacked between the active pattern 121AP and the source electrode 141S and between the active pattern 121AP and the drain electrode 141D. Ohmic contact patterns 1230P may be stacked between the metal patterns 129MP and the active pattern 121AP.

The gate electrode 105GE may protrude from the gate line 105GL towards a pixel area. The active pattern 121AP may be disposed on the gate insulating layer 111 to overlap the gate electrode 105GE. The source electrode 141S may extend from the bridge pattern 141B and may be overlapped on the active pattern 121AP. The drain electrode 141D may be spaced apart from the source electrode 141S, face the source electrode 141S and be overlapped on the active pattern 121AP. In an exemplary embodiment, a shape of the source electrode 141 S that is overlapped on the active pattern 121AP may include various shapes such as a Y shape, an I shape, and the like. A shape of the drain electrode 141D disposed on the active pattern 121AP may also change variously.

The metal patterns 129MP may expose a portion of the active pattern 121AP which does not overlap the source electrode 141S and the drain electrode 141D. In an exemplary embodiment, the metal patterns 129MP may include a conductive material having a lower resistance than those of the source electrode 141S and the drain electrode 141D, and may reduce resistance of the source electrode 141S and the drain electrode 141D.

The ohmic contact patterns 1230P may be disposed similar to the metal patterns 129MP and may expose a portion of the active pattern 121AP which does not overlapping the source electrode 141S and the drain electrode 141D.

The pixel electrode 141PX may extend from the drain electrode 141D to the pixel area. In an exemplary embodiment, the pixel electrode 141PX may be a pixel electrode of a liquid crystal display device or a pixel electrode of an organic light emitting display device.

The gate line 105GL, the gate electrode 105GE, the first gate pad portion 105GP, the data lines 105DL and the first data pad portion 105DP may form a first conductive pattern group by patterning the first conductive layer in one mask process. The pixel electrode 141PX, the bridge pattern 141B, the second gate pad portion 141GP, the second data pad portion 141DP, the source electrode 141S and the drain electrode 141D may form a second conductive pattern group by patterning the second conductive layer in one mask process. Components that make up the same conductive pattern group may have the same layer structure.

Hereinafter, cross sections of the above-described components will be described in further detail.

The above-described components may be disposed on the substrate 101. In an exemplary embodiment, the substrate 101 may be an insulating substrate, including transparent glass or plastic.

The first conductive pattern group 105GL, 105GE, 105GP, 105DL and 105DP may be disposed on the substrate 101 with a buffer layer 103 therebetween. In an exemplary embodiment, the buffer layer 103 may include silicon oxide layer, silicon nitride layer and the like, and depending on the circumstances, the buffer layer 103 may be omitted. In an exemplary embodiment, the first conductive pattern group 105GL, 105GE, 105GP, 105DL and 15DP may include various metals such as aluminum, copper, silver, molybdenum, chrome, tungsten and the like. The first conductive pattern group 105GL, 105GE, 105GP, 105DL and 105DP may include a single layer including any one of the above-described metals or of a single layer including an alloy of the above-described metals. In an exemplary embodiment, the first conductive pattern group 105GL, 105GE, 105GP, 105DL and 105DP may include at least double layers. In an exemplary embodiment, the first conductive pattern group 105GL, 105GE, 105GP, 105DL and 105DP may include a stacked structure of titanium (Ti) which is a barrier metal and copper (Cu) which is a low resistance metal. The barrier metal may be stacked on an upper portion of the low resistance metal, on a lower portion of the low resistance metal or the upper and lower portions of the low resistance metal.

The first conductive pattern group 105GL, 105GE, 105GP, 105DL and 105DP may be disposed on the substrate 101, and may be covered by the gate insulating layer 111 that is passed through by a gate pad hole H_GP, a data pad hole H_DP and a bridge contact hole H_BC. The gate insulating layer 111 may include a single layer- or a double layer-structure including at least any one of the silicon nitride layer or the silicon oxide layer.

The gate insulating layer 111 may be covered by a first protective layer 131 and 133 of at least a single layer that is passed through by the gate pad hole H_GP, the data pad hole H_DP, the bridge contact hole H_BC and the active hole H_A. In an exemplary embodiment, the first protective layer may include a lower protective layer 131 that includes at least any one layer of the silicon nitride layer or the silicon oxide layer and an upper protective layer 133 that is stacked on the lower protective layer and that includes an organic layer having a flat surface.

The gate pad hole H_GP may expose a first gate pad portion 105GP by passing through the first protective layer 131 and 133 and the gate insulating layer 111. The data pad hole H_DP may expose the first data pad portion 105DP by passing through the first protective layer 131 and 133 and the gate insulating layer 111.

The bridge contact hole H_BC may expose one ends of each of the data lines 105DL adjacent to the gate line 105GL by passing through the first protective layer 131 and 133 and the gate insulating layer 111. The bridge contact hole H_BC may be defined to have a wider width than each width of the data lines 105DL in order to secure contact margin of the bridge pattern 141B and the data lines 105DL.

The active hole H_A may have a size that is equal to or greater than that of the active pattern 121AP. The active hole H_A may expose the active pattern 121AP in its entirety. The width of the active hole H_A may be equal to or greater than the width WA of the active pattern 121AP. Each of the widths of the active hole H_A and the active pattern 121AP may be smaller than that of the gate electrode 105GE. The active pattern 121AP exposed through the active hole H_A may be disposed on the gate electrode 105GE with the gate insulating layer 111 therebetween. The gate insulating layer 111 may be disposed between the active pattern 121AP and the first conductive pattern group 105GL, 105GE, 105GP, 105DL and 105DP. In an exemplary embodiment, the active pattern 121AP may include a semiconductor layer, for example. In an exemplary embodiment, the active pattern 121AP may include amorphous silicon, for example.

The ohmic contact patterns 1230P may contact the active pattern 121AP. The ohmic contact patterns 1230P may include a semiconductor layer doped with impurities. In an exemplary embodiment, the active pattern 121AP may include amorphous silicon doped with N-typed impurities, for example.

The metal patterns 129MP may contact the ohmic contact patterns 1230P. The metal patterns 129MP may include a low resistance metal layer. In an exemplary embodiment, each of the metal patterns 129MP may include a stacked structure of the low resistance metal layer 125 and the barrier metal layer 127. In an exemplary embodiment, the low resistance metal layer 125 may include copper (Cu), for example. In an exemplary embodiment, the barrier metal layer 127 may include titanium (Ti), for example. The metal patterns 129MP according to an exemplary embodiment may include various metals having a lower resistance than that of the second conductive pattern group 141PX, 141B, 141GP, 141DP, 141S and 141D in addition to the above-described stack structure of Cu and Ti. The barrier metal layer 127 may be further stacked on the lower portion of the low resistance metal layer 125.

The second conductive pattern group 141PX, 141B, 141GP, 141DP, 141S and 141D may be defined on the first protective layer 131 and 133 that includes the gate pad hole H_GP, the data pad hole H-DP, the bridge contact hole H_BC and the active hole H_A. The first protective layer 131 and 133 may be disposed between the second conductive pattern group 141PX, 141B, 141GP, 141DP, 141S and 141D and the gate insulating layer 111.

The second conductive pattern group 141PX, 141B, 141GP, 141DP, 141S and 141D may include a transparent conductive layer. In an exemplary embodiment, the second conductive pattern group 141PX, 141B, 141GP, 141DP, 141S and 141D may include a transparent conductive oxide ("TCO") such as indium zinc oxide ("IZO"), indium tin oxide ("ITO"), gallium indium zinc oxide ("GIZO") and gallium doped zinc oxide ("GZO").

The bridge pattern 141B may fill the bridge contact hole H_BC and may contact the data lines 105DL. The data lines 105DL that are arranged along the second direction Y through the bridge pattern 141B may be coupled to transfer signal from the data pad portion DP. Both ends of the bridge pattern 141B may be provided to have a relatively wider width compared to those of other areas.

A size of the second gate pad portion 141GP may be equal to or greater than that of the gate pad hole H_GP. The second gate pad portion 141GP may contact the first gate pad portion 105GP through the gate pad hole H_GP. In an exemplary embodiment, the second gate pad portion 141GP may include a transparent conductive oxide material and protect the first gate pad portion 105GP, for example.

A size of the second data pad portion 141DP may be equal to or greater than that of the data pad hole H_DP. The second data pad portion 141 DP may contact the first data pad portion 105DP through the data pad hole H_DP. In an exemplary embodiment, the second data pad portion 141DP may include a transparent conductive oxide material and protect the first data pad portion 105DP, for example.

The active pattern 121AP exposed by the active hole H_A, the source electrode 141S, the drain electrode 141D may be covered by the second protective layer pattern 151. In an exemplary embodiment, the second protective layer pattern 151 may include at least any one of the silicon nitride layer or the silicon oxide layer, for example. The second protective layer pattern 151 may cover a portion of the source electrode 141S and the drain electrode 141D overlapping the active pattern 121AP.

An opaque resin pattern 153 overlapping the active pattern 121AP may be further defined on the second protective layer pattern 151. The opaque resin pattern 153 may expose the pixel area and the pixel electrode 141PX as an island type pattern overlapping the active pattern 121AP. The opaque resin pattern 153 may act as a black matrix blocking light or as a column spacer, provided with consistent thickness, which maintains space between upper and lower substrates of a display device. In an exemplary embodiment, the second protective layer pattern 151 may include the same pattern as the opaque resin pattern 153. The second protective layer pattern 151 may expose the gate pad GP and the data pad DP.

In an exemplary embodiment, the data lines 105DL may not overlap the gate line 105GL. Unlike the embodiment, in the event that the data lines 105DL and the gate line 105GL overlap each other, since one line is disposed along the step that is provided by another line, there may be change in thickness of the line disposed on the upper portion. Hereinafter, an example where the data lines 105DL are disposed on an upper layer of the gate line 105GL overlapping the gate line 105GL will be provided. A portion of the data line 105DL overlapping the gate line 105GL may have a thickness that is thin compared to those of other areas due to the step as a result of the gate line 105GL or may be disconnected. In an exemplary embodiment, by causing the data lines 105DL not to overlap the gate line 105GL, disconnection of the data lines due to the step of the gate line 105GL may be fundamentally prevented.

In an exemplary embodiment, since the data lines 105DL are electrically coupled through the bridge pattern 141B, signal from the data pad DP may be transferred to the data lines 105DL. The bridge pattern 141B may be disposed on the first protective layer 133 having a flat surface. Therefore, even when the bridge pattern 141B overlaps the gate line 105GL, it may not be disconnected due to the step of the gate line 105GL.

In an exemplary embodiment, since there is no need to form the gate line 105GL to have a thin thickness due to disconnection problems, the thickness of the gate line 105GL may be made sufficiently thick.

In an exemplary embodiment, the active pattern 121AP may not overlap the data lines 105DL. Unlike an exemplary embodiment, when the active pattern 121AP overlaps the lower portion of the data lines 105DL, the active pattern 121AP may protrude to both ends of the data lines 105DL due to characteristics of an etch process. When the active pattern 121AP protrudes to both ends of the data lines 105DL, since an opening ratio of the display device is deteriorated, there may be restrictions to forming the thickness of the data lines 105DL thick to secure opening ratio. In an exemplary embodiment, since the active pattern 121AP does not overlap the lower portion of the data lines 105DL, the opening ratio of the display device may be enhanced, and the thickness of the data lines 105DL may be made sufficiently thick.

In an exemplary embodiment, since the data lines 105DL and the gate line 105GL may be concurrently patterned, the process of manufacturing a TFT array substrate may be simplified. In an exemplary embodiment, since the bridge pattern 141B, the source electrode 141S and the drain electrode 141D may be concurrently patterned with the pixel electrode 141PX, the process of manufacturing a TFT array substrate may be simplified.

Hereinafter, a method for manufacturing a TFT array substrate according to an exemplary embodiment will be described with reference to FIGS. 3A to 7B. The cross-sectional views described below are views which have been cut along line "IV-IV" shown in the plan views.

FIGS. 3A and 3B are a plan view and a cross-sectional view, respectively, for illustrating a first mask process according to an exemplary embodiment.

Referring to FIGS. 3A and 3B, a first conductive pattern group 105GL, 105GE, 105GP, 105DL and 105DP may be disposed on a substrate 101 using a first mask process. A buffer layer 103 may be further disposed between the first conductive pattern group 105GL, 105GE, 105GP, 105DL and 105DP and the substrate 101. The buffer layer 103 may be omitted depending on the circumstances. Hereinafter, the first mask process will be described in further details.

For the first mask process, a first conductive layer may be first disposed on the substrate 101. The first conductive layer may be provided as a single layer or as a multi-layer structure such as double layer and more. Before the first conductive layer is provided, the buffer layer 103 may be disposed on the substrate 101. The first conductive layer may include various metals. In an exemplary embodiment, the first conductive layer may be provided as a stack structure of a barrier metal layer including titanium (Ti) and a low resistance metal layer including copper (Cu), for example. The barrier metal layer may be stacked on the upper portion of the low resistance metal layer, on the lower portion of the low resistance metal layer or on the upper and lower portions of the low resistance metal layer.

A first mask pattern (not shown) may be disposed on the first conductive layer. In an exemplary embodiment, the first mask pattern may be provided as photoregist pattern provided through a photolithography process, for example. The first conductive layer may be etched in an etch process using the first mask pattern as an etch barrier to form the first conductive pattern group 105GL, 105GE, 105GP, 105DL and 105DP. The buffer layer 103 may be etched. The first conductive pattern group 105GL, 105GE, 105GP, 105DL and 105DP may include a gate line 105GL, a gate electrode 105GE, a first gate pad portion 105GP, data lines 105DL and a first data pad portion 105DP as described with reference to FIGS. 1 to 2C. The first mask pattern may be removed after forming the first conductive pattern group 105GL, 105GE, 105GP, 105DL and 105DP.

Figure 4A:
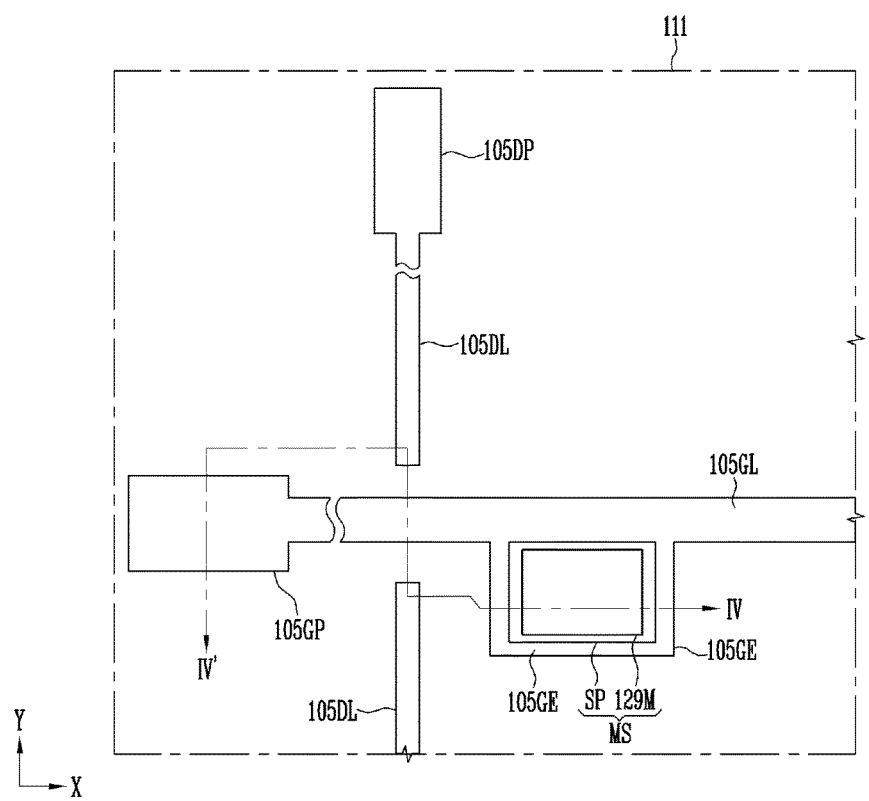
FIGS. 4A and 4B are a plan view and a cross-sectional view, respectively, for illustrating an exemplary embodiment of a second mask process according to the invention.
Figure 4B:
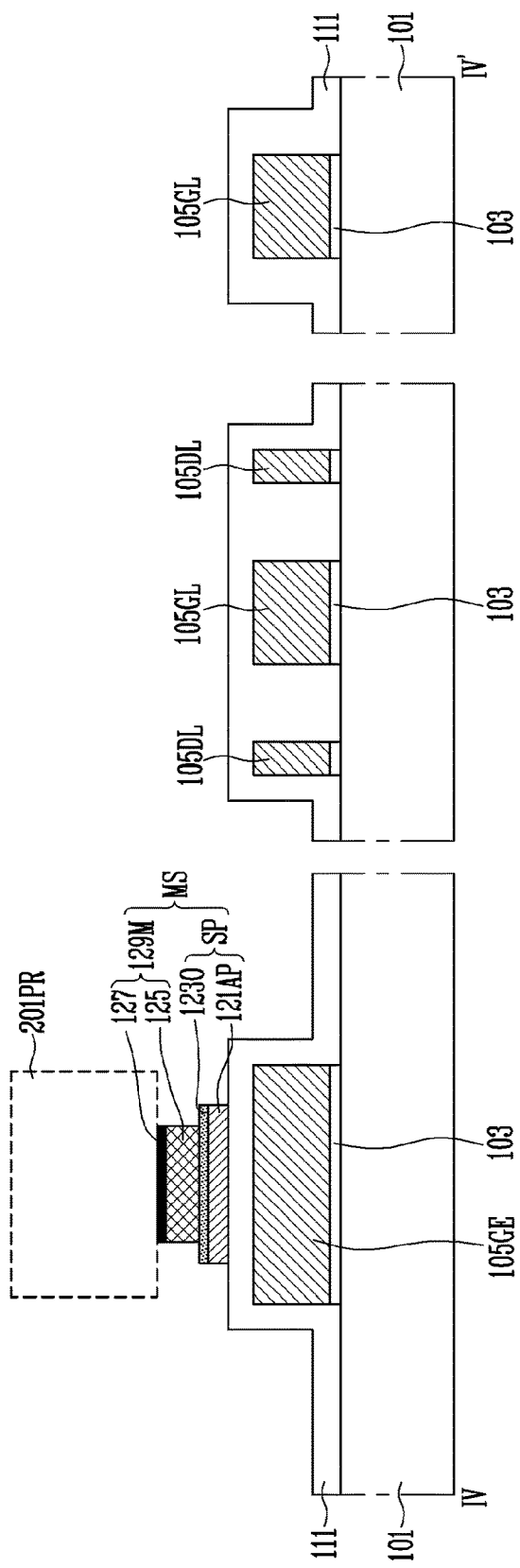

FIGS. 4A and 4B are a plan view and a cross-sectional view, respectively, for illustrating a second mask process according to an exemplary embodiment.

Referring to FIGS. 4A and 4B, before performing a second mask process, a gate insulating layer 111 covering a first conductive pattern group 105GL, 105GE, 105GP, 105DL and 105DP may be disposed on a substrate 101.

Using the second mask process, on the gate insulating layer 111, a stack structure MS where a semiconductor pattern SP and a preliminary metal pattern 129M are stacked may be provided to overlap a gate electrode 105GE. Hereinafter, the second mask process will be described in further details.

For the second mask process, a first semiconductor layer, a second semiconductor layer and a metal layer may be sequentially stacked on the gate insulating layer 111 first. The first semiconductor layer may include amorphous silicon layer. The second semiconductor layer may be a doped layer with impurities. In an exemplary embodiment, the semiconductor layer may include amorphous silicon layer doped with N-typed impurities. The first and second semiconductor layer may have distinguishable layers by injecting N-typed impurities into the amorphous silicon layer surface after deposition of the amorphous silicon layer. The metal layer may include a single layer structure or a multi layer structure such as double layers. The metal layer may include a material having a low resistance compared to a transparent conductive layer. In an exemplary embodiment, the metal layer may be provided as a double layer-structure including a low resistance metal layer 125 including copper (Cu) and a barrier metal layer 127 stacked on the low resistance metal layer 125 and including titanium (Ti). The barrier metal layer 127 may be further stacked between the low resistance metal layer 125 and the semiconductor pattern SP.

A second mask pattern 201PR may be disposed on the metal layer. In an exemplary embodiment, the second mask pattern 201PR may be provided as a photoregist pattern provided through a photolithography process. By etching the metal layer in an etch process using the second mask pattern PR as an etch barrier, a preliminary metal pattern 129M may be provided. The metal layer may be etched using a wet etch process. In an exemplary embodiment, when the metal layer is provided as a stack structure including the low resistance metal layer 125 including copper (Cu) and the barrier metal layer 127 including titanium (Ti), an etch material such as ammonium peroxodisulfate ("APS"), nitric acid and 5-aminotetrazol ("ATZ"), for example. Due to isotropy etching characteristics of a wet etch process, the preliminary metal pattern 129M that is patterned using the wet etch process may be provided smaller than the second mask pattern 201PR.

The semiconductor pattern SP may be provided by etching the semiconductor layer in an etch process using the second mask pattern 201PR as an etch barrier. The semiconductor pattern SP may include an active pattern 121AP including the first semiconductor layer and a preliminary ohmic contact pattern 1230 including a second semiconductor layer. A size of the semiconductor pattern SP may be equal to or greater than that of the preliminary metal pattern 129M by means of etch in a dry etch process. An upper edge of the preliminary ohmic contact pattern 1230 and the active pattern 121AP of the semiconductor pattern SP may be exposed by the preliminary metal pattern 129M.

The second mask pattern 201PR may be removed after forming a stack structure MS including the preliminary metal pattern 129M and the semiconductor pattern SP.

As described above, the semiconductor pattern SP which includes the active pattern 121AP may be patterned separately from the data lines 105DL and may be disposed on the upper portion of the first conductive pattern group including the data lines 105DL. Unlike an exemplary embodiment, when the active pattern 121AP may be disposed on a lower portion of the data lines 105DL and the active pattern 121AP and the data lines 105DL are patterned using the same mask process, the active pattern 121AP may protrude to both sides of the data lines 105DL. Here, the active pattern 121AP protruding to both sides of the data lines 105DL may reduce the opening ratio of the display device. In order to prevent deterioration in the opening ratio, the data lines 105D1 may be provided thin. Here, it may be difficult to secure electrical characteristics of the data lines 105DL, and the data lines may be disconnected. In an exemplary embodiment, a process may be performed such that the active pattern 121AP does not overlap the lower portion of the data lines 105DL, thereby securing sufficient thickness of the data lines 105DL. In addition, the deterioration in the opening ratio due to the active pattern 121AP may be prevented.

In an exemplary embodiment, the data lines 105DL may be provided using a different mask process from the active pattern 121AP. Since the data lines 105DL are provided using the same mask process as the gate line 105GL, a process for manufacturing a TFT array substrate may be simplified.

Figure 5A:
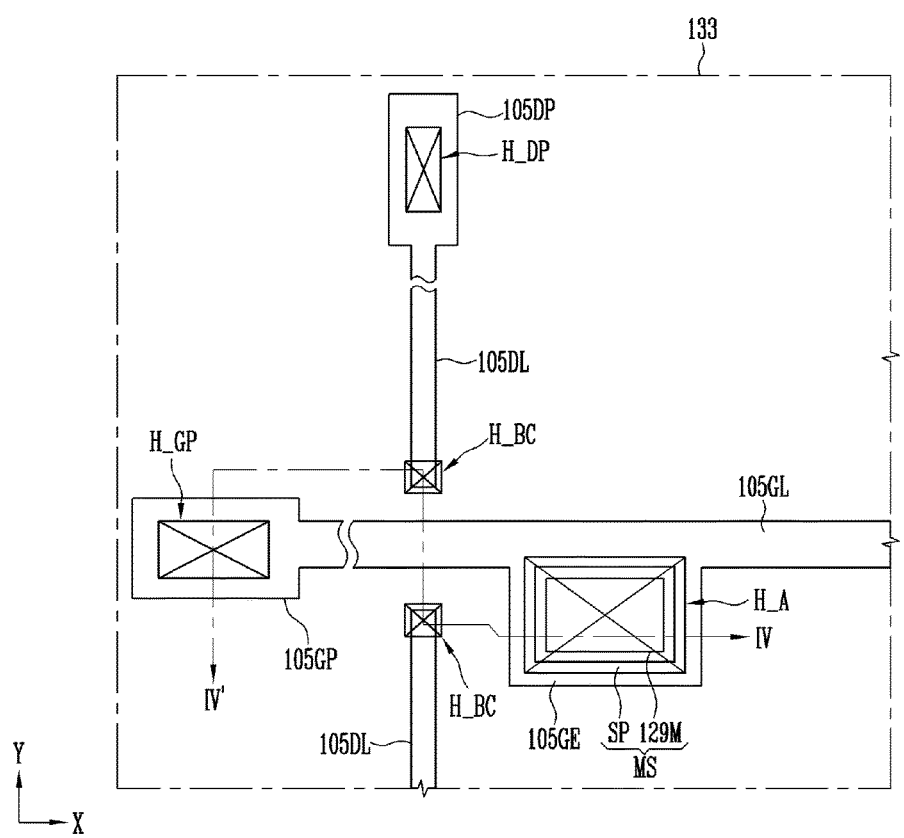
Figure 5C:
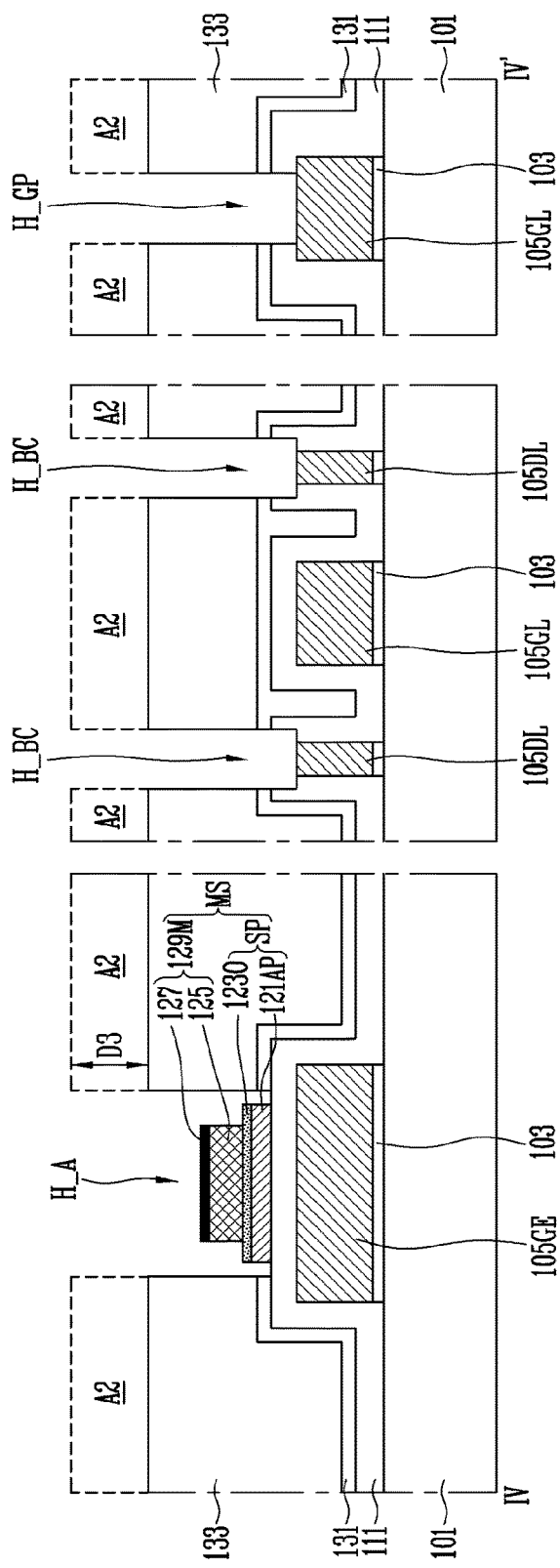

FIGS. 5A to 5C are a plan view and cross-sectional views, respectively, for illustrating a third mask process according to an exemplary embodiment.

Referring to FIGS. 5A and 5B, a first protective layer 131 and 133 covering the stack structure MS may be disposed on the gate insulating layer 111. The first protective layer may be disposed on a lower protective layer 131 including at least any one of the silicon nitride layer or the silicon oxide layer and an upper protective layer 133 disposed on the lower protective layer 131 and having a flat surface including an organic layer.

A third mask pattern 203PR may be disposed on the first protective layer 131 and 133. The third mask pattern 203PR may be provided as a photoregist pattern provided through a photolithography process. The third mask pattern 203PR may be provided through a light exposure process and a developing process using a half-tone light exposure mask. The third mask pattern 203PR may be provided to include openings OP, a first area A1 having a first thickness D1 and a second area A2 having a second thickness D2 greater than the first thickness D1. The openings OP of the third mask pattern 203PR may expose ends of the data lines 103DL adjacent to the gate line 105GL, a first gate pad portion 105GP and a first data pad portion 105DP. A size of the first area A1 may be equal to or greater than that of the stack structure MS overlapping the entire upper surface of the stack structure MS.

The first protective layer 131 and 133 may be etched in an etch process using the third mask pattern 203PR as an etch barrier. A portion of the first protective layer 131 and 133 may be etched. In an exemplary embodiment, the lower protective layer 131 may be exposed by etching the upper protective layer 133 of the first protective layer 131 and 133.

Referring to FIGS. 5A to 5C, a thickness of a third mask pattern 203PR as described with reference to FIG. 5B may be reduced. The thickness of the third mask pattern 203PR may be reduced as much as a first thickness D1 of a first area A1 as shown in FIG. 5B. The first area A1 shown in FIG. 5A is removed. A second area A2 may remain with a third thickness D3 that is less than a second thickness D2 shown in FIG. 5B. A stack structure MS may be exposed due to the remaining second area A2.

The lower protective layer 131 of the first protective layer and the gate insulating layer 111 may be etched in an etch process using the remaining second area A2 as an etch barrier to form an active hole H_A, a bridge contact hole H_B, a gate pad hole H_GP and a data pad hole H_DP. The active hole H_A may be provided to have a size equal to or greater than that of the semiconductor pattern SP to expose an entire area of the stack structure MS. The bridge contact hole H_BC may expose an end of the data lines 105DL adjacent to the gate line 105GL. The gate pad hole H_GP may expose the first gate pad portion 105GP. The data pad hole H_DP may expose the first data pad portion 105DP.

After the active hole H_A, the bridge contact hole H_B, the gate pad hole H_GP and the data pad hole H_DP are provided, the remaining second area A2 may be removed.

During the etch process in which the third mask process is performed, the semiconductor pattern SP may be protected by the preliminary metal pattern 129M.

Figure 6A:
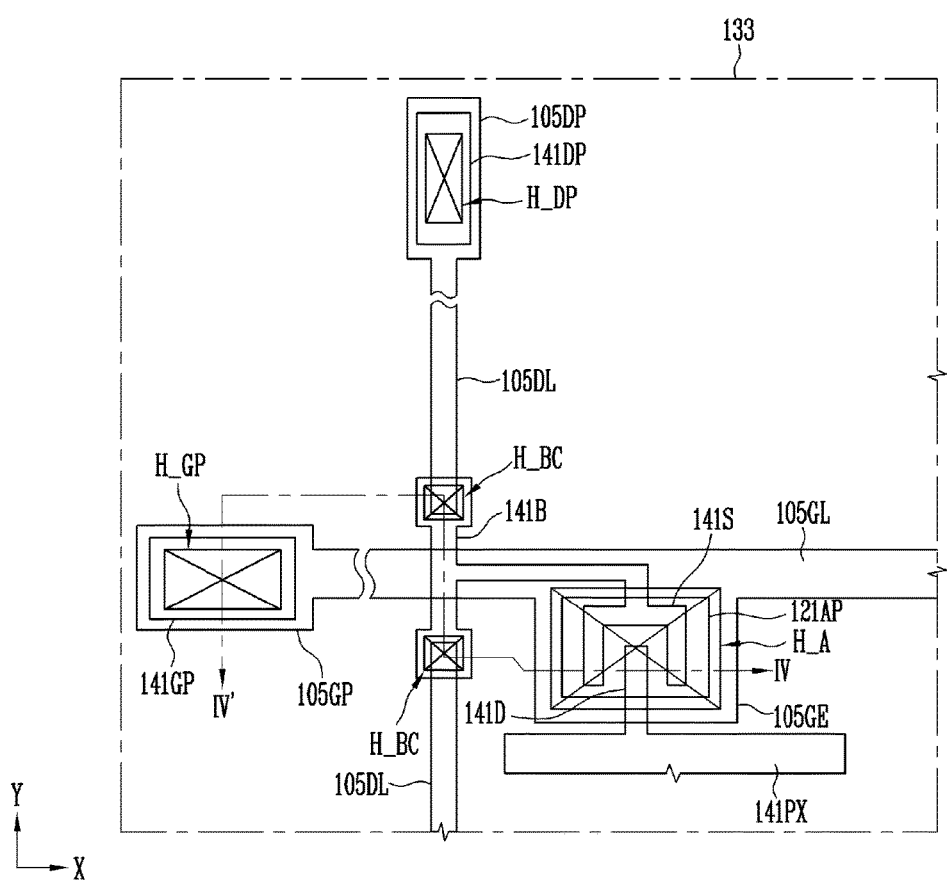
FIGS. 6A and 6B are a plan view and a cross-sectional view, respectively, for illustrating an exemplary embodiment of a fourth mask process according to the invention.
Figure 6B:
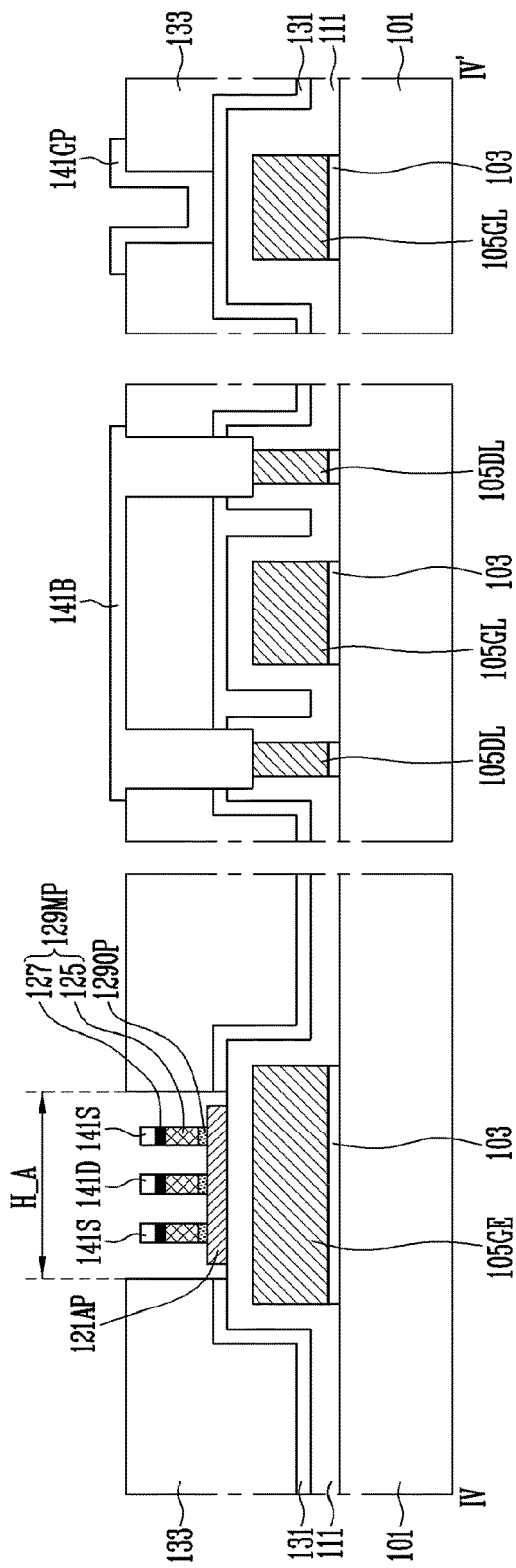

FIGS. 6A and 6B are a plan view and a cross-sectional view, respectively, for illustrating a fourth mask process according to an exemplary embodiment.

Referring to FIGS. 6A and 6B, a second conductive pattern group 141PX, 141B, 141GP, 141DP, 141S and 141D, metal patterns 129MP and ohmic contact patterns 1290P may be provided using a fourth mask process. Hereinafter, the fourth mask process will be described in further details.

For the fourth mask process, first, a second conductive layer may be disposed on a first protective layer 131 and 133 including an active hole H_A, a bridge contact hole H_B, a gate pad hole H_GP, and a data pad hole HDP. The second conductive layer may be a transparent conductive layer. In an exemplary embodiment, the second conductive layer may include a TCO such as IZO, ITO, GIZO and GZO, for example.

A fourth mask pattern (not shown) may be disposed on the second conductive layer. A fourth mask pattern may be provided as a photoregist pattern provided through a photolithography process. The second conductive pattern group 141PX, 141B, 141GP, 141DP, 141S and 141D may be provided by etching the second conductive layer in an etch process using the fourth mask pattern as an etch barrier. The second conductive pattern group 141PX, 141B, 141GP, 141DP, 141S and 141D may, as described with reference to FIGS. 1 to 2C, include a pixel electrode 141PX, a bridge pattern 141B, a second gate pad portion 141GP, a second data pad portion 141DP, a source electrode 141S and a drain electrode 141D.

Metal patterns 129MP and ohmic contact patterns 1290P may be provided by etching the metal patterns 129 in FIGS. 5A to 5C and the preliminary ohmic contact patterns 1230 in FIGS. 4A and 4B exposed by the second conductive pattern group 141PX, 141B, 141GP, 141DP, 141S and 141D. The metal patterns 129MP and the ohmic contact patterns 1290P may be provided by exposing a portion of an active pattern 121AP which does not overlap a source electrode 141S and a drain electrode 141D. The metal pattern 129MP and the ohmic contact pattern 1290P overlapped at a lower portion of the source electrode 141S and the metal pattern 129MP and the ohmic contact pattern 1290P overlapped at a lower portion of the drain electrode 141D may be spaced apart from each other. A channel area may be defined at the active pattern 121AP.

In an exemplary embodiment, a size of the active hole H_A may be equal to or greater than a size of the active pattern 121AP. In an exemplary embodiment, a portion of the preliminary ohmic contact pattern 1230 in FIGS. 4A and 4B provided at an upper edge of the active pattern 121AP may be removed using the fourth mask process. As a result, in an exemplary embodiment, the ohmic contact pattern overlapping the source electrode 141S and the ohmic contact pattern overlapping the drain electrode 141D may be separated from each other.

After the second pattern group 141PX, 141B, 141GP, 141DP, 141S and 141D, the metal patterns 129MP and the ohmic contact patterns 1290P are provided, the fourth mask pattern may be removed.

In an exemplary embodiment, the bridge pattern 141B, the source electrode 141S, and the drain electrode 141D may be provided concurrently with the pixel electrode 141PX. Therefore, the process for manufacturing a TFT array substrate may be simplified.

In an exemplary embodiment, by having the source electrode 141S and the drain electrode 141D contact the metal patterns 129MP whose resistance is lower than that of the transparent conductive layer, resistance of the source electrode 141 S and the drain electrode 141D may be secured.

In an exemplary embodiment, the source electrode 141S and the drain electrode 141D may be patterned separately from the active pattern 121AP. Therefore, the length of the channel area between the source electrode 141S and the drain electrode 141D may be minutely provided. Unlike an exemplary embodiment, the active pattern 121AP may be patterned using the same mask process as the source electrode 141S and the drain electrode 141D. After the source electrode 141S and the drain electrode 141D are etched, while the active pattern 12 1Ap is etched, the space between the source electrode 141 S and the drain electrode 141D becomes larger and the channel area becomes longer as the source electrode 141S and the drain electrode 141D are etched, it may be difficult to secure width of the source electrode 141S and the drain electrode 141D. In an exemplary embodiment, the process for patterning the active pattern 121AP and the process for patterning the source electrode 141S and the drain electrode 141D are separated. The length of the channel area may therefore be minutely provided, and the width of the source electrode 141S and the drain electrode 141D may be sufficiently secured.

Figure 7A:
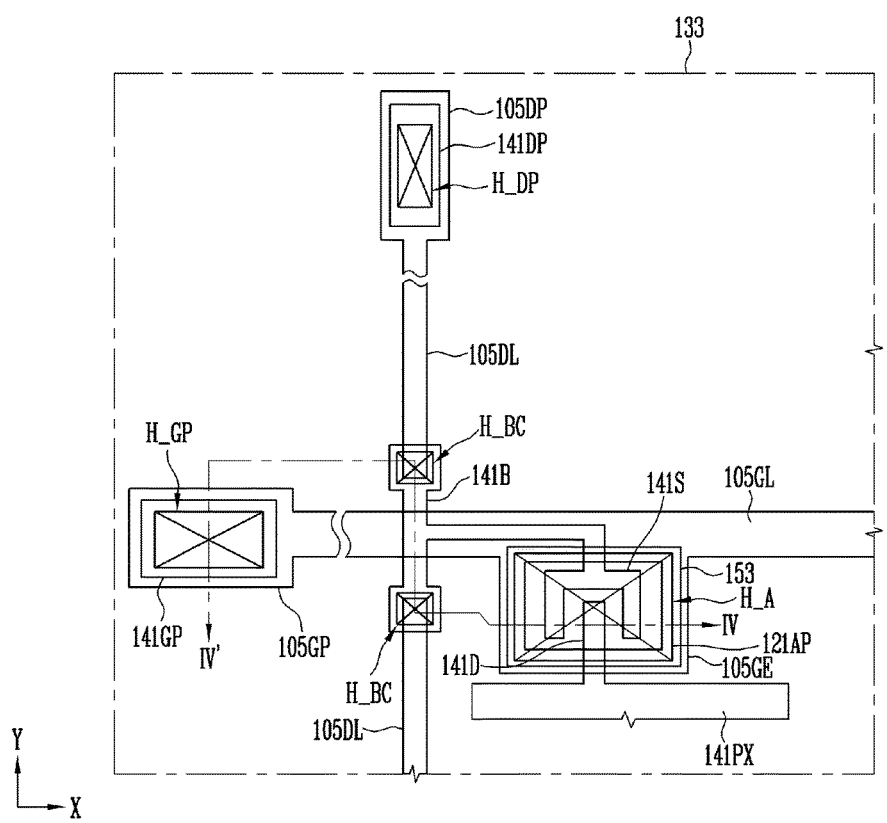
FIGS. 7A and 7B are a plan view and a cross-sectional view, respectively, for illustrating an exemplary embodiment of a process for forming an opaque resin pattern according to the invention.
Figure 7B:
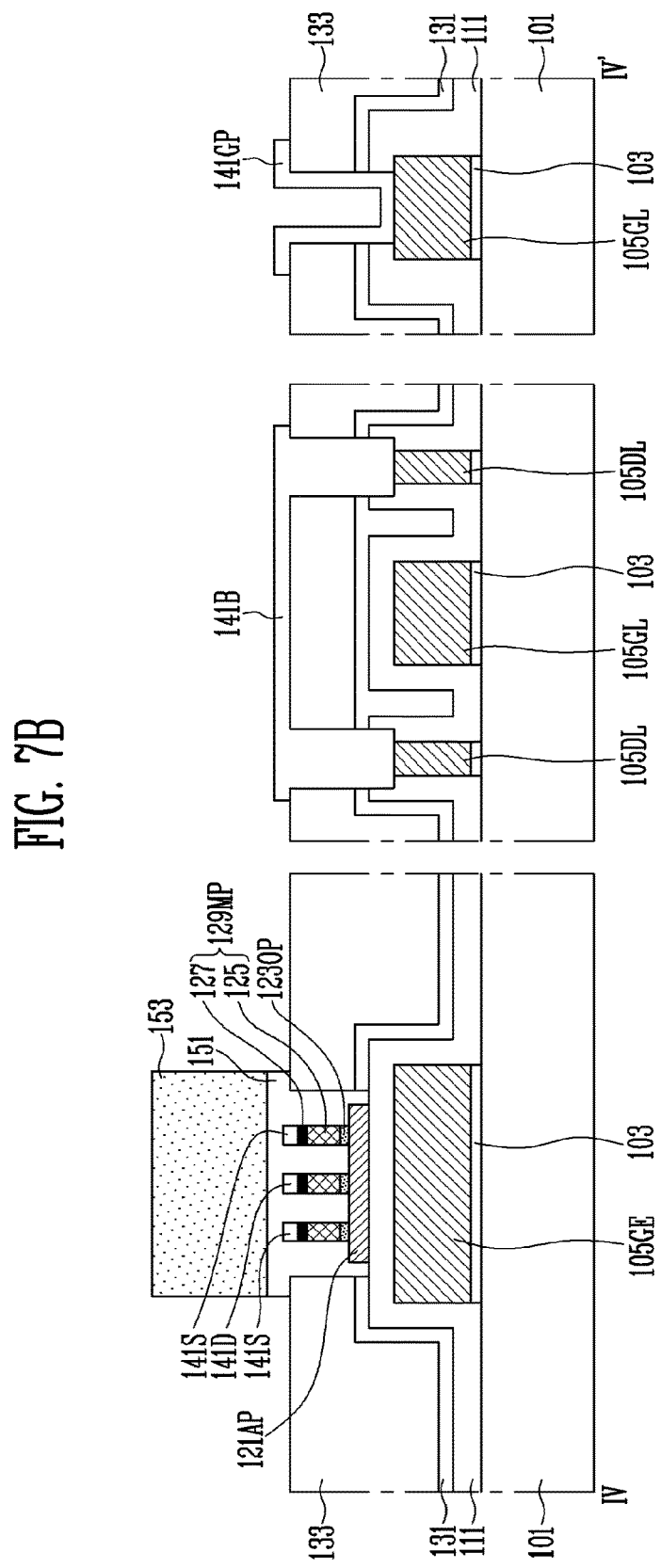

FIGS. 7A and 7B are a plan view and a cross-sectional view, respectively, for illustrating a process for forming an opaque resin pattern according to an exemplary embodiment.

Referring to FIGS. 7A and 7B, in order to protect an active pattern 121AP exposed through an active hole H_A, a second protective layer may be disposed on a first protective layer 131 and 133 to cover the active pattern 121AP exposed through a second conductive pattern group 141PX, 141B, 141GP, 141DP, 141S and 141D and the active hole H_A. An opaque resin layer may be disposed on the second protective layer. A fifth mask pattern (not shown) may be disposed on the opaque resin layer. The fifth mask pattern may be a photoregist pattern provided through a photolithography process.

The opaque resin pattern 153 and the second protective layer pattern 151 may be provided by etching the opaque resin layer and the second protective layer in an etch process using the fifth mask pattern as an etch barrier. The fifth mask pattern may be removed.

The opaque resin pattern 153 may act as a black matrix or a column spacer as described with reference to FIGS. 1 to 2C. In an exemplary embodiment, by forming the second protective layer pattern 151 that protects the active pattern 121AP using a process for patterning the opaque resin pattern 153, the process for manufacturing a TFT array substrate may be simplified. The second protective layer pattern 151 may be provided as the same pattern as the opaque resin pattern 153 and may expose a gate pad GP and a data pad DP. A size of the second protective layer pattern 151 and the opaque resin pattern 153 may be equal to or greater than that of the active hole H_A to protect the active pattern 121AP but may be equal to or less than that of the gate electrode 105GE to prevent deterioration in opening ratio.

By way of summation and review, in an exemplary embodiment, data lines and a first conductive pattern group including a gate line may include a same material layer concurrently. The data lines and the gate line do not overlap each other. In an exemplary embodiment, disconnection of the data lines resulting from end difference due to the gate line at an overlapping section of the data lines and the gate line may be fundamentally prevented. In an exemplary embodiment, since it is not necessary to restrict the thickness of the gate line to be thin to prevent disconnection of the data lines, the gate line may be made sufficiently thick.

In an exemplary embodiment, the source electrode that is coupled to the data line and the drain electrode that faces the source electrode may be patterned in a mask process separate from the active pattern. In an exemplary embodiment, it is not necessary to place restrictions on process conditions due to undercut resulting from the process of patterning the source electrode and the drain electrode and the active pattern in one mask process. In an exemplary embodiment, the channel area between the source electrode and the drain electrode may be minute, and the width of the source electrode and the drain electrode may be sufficiently secured.

Exemplary embodiments have been disclosed herein, and although specific terms are employed, they are used and are to be interpreted in a generic and descriptive sense only and not for purpose of limitation. In some instances, as would be apparent to one of ordinary skill in the art as of the filing of the application, features, characteristics, and/or elements described in connection with a particular embodiment may be used singly or in combination with features, characteristics, and/or elements described in connection with other exemplary embodiments unless otherwise specifically indicated. Accordingly, it will be understood by those of skill in the art that various changes in form and details may be made without departing from the spirit and scope of the invention as set forth in the following claims.

What is claimed is:

1. A thin film transistor array substrate, comprising:
   a first conductive pattern group disposed as a same layer, the first conductive group including a gate line extending along a first direction, data lines extending along a second direction crossing the first direction and spaced apart from each other along the second direction with the gate line therebetween, and a gate electrode protruding from the gate line;
   an active pattern which is disposed on the gate electrode and overlaps the gate electrode;
   a second conductive pattern group disposed as a same layer, the second conductive pattern group including a bridge pattern coupling the data lines, a source electrode extending to an upper portion of the active pattern from the bridge pattern, a drain electrode spaced apart from the source electrode, facing the source electrode and a pixel electrode extending from the drain electrode and disposed on the active pattern; and
   metal patterns each stacked between the active pattern and the source electrode and between the active pattern and the drain electrode.

2. The thin film transistor array substrate as claimed in claim 1, further comprising ohmic contact patterns stacked between the metal patterns and the active pattern.

3. The thin film transistor array substrate as claimed in claim 2, wherein the metal patterns and the ohmic contact patterns expose an area of the active pattern which does not overlap the source electrode and the drain electrode.

4. The thin film transistor array substrate as claimed in claim 2, wherein the ohmic contact patterns include a semiconductor layer doped with impurities.

5. The thin film transistor array substrate as claimed in claim 1, further comprising:
   a gate insulating layer disposed between the first conductive pattern group and the active pattern, covering the first conductive pattern group and being passed through by bridge contact holes exposing the data lines;
   a first protective layer disposed between the gate insulating layer and the second conductive pattern group, and being passed through by an active hole exposing the active pattern and the bridge contact holes and having a flat surface;
   a second protective layer pattern covering the active pattern; and
   an opaque resin pattern disposed on the second protective layer pattern.

6. The thin film transistor array substrate as claimed in claim 5, wherein the bridge pattern is disposed between every pair of data lines adjacent to each other among the data lines and fills the bridge contact holes.

7. The thin film transistor array substrate as claimed in claim 5, wherein a size of the active hole is equal to or greater than that of the active pattern.

8. The thin film transistor array substrate as claimed in claim 5, wherein a size of the second protective layer pattern and the opaque resin pattern is equal to or greater than a size of the active hole, or equal to or less than a size of the gate electrode.

9. The thin film transistor array substrate as claimed in claim 1,
   wherein the first conductive pattern group further comprises a first gate pad portion extending from one end of the gate line and a first data pad portion extending from one end of an outermost data line among the data lines,
   wherein the second conductive pattern group further comprises a second gate pad portion coupled to the first gate pad portion and a second data pad portion coupled to the first data pad portion.

10. The thin film transistor array substrate as claimed in claim 1, wherein the second conductive pattern group is formed of a transparent conductive layer.

11. The thin film transistor array substrate as claimed in claim 1, wherein the metal patterns include a conductive material having a lower resistance than that of the second conductive pattern group.

* * * * *